United States Patent [19]
von Sichart

[11] 4,415,883
[45] Nov. 15, 1983

[54] CIRCUIT ARRANGEMENT FOR CONVERTING DIGITAL SIGNALS IN PARTICULAR PCM SIGNALS, INTO CORRESPONDING ANALOG SIGNALS WITH A R-2R CHAIN NETWORK

[75] Inventor: Frithjof von Sichart, Munich, Fed. Rep. of Germany

[73] Assignee: Siemens Aktiengesellschaft, Berlin & Munich, Fed. Rep. of Germany

[21] Appl. No.: 303,122

[22] Filed: Sep. 17, 1981

Related U.S. Application Data

[63] Continuation of Ser. No. 54,412, Jul. 3, 1979, abandoned.

[30] Foreign Application Priority Data

Sep. 1, 1978 [DE] Fed. Rep. of Germany ....... 2838310

[51] Int. Cl.³ .............................................. H03K 13/02
[52] U.S. Cl. ..................... 340/347 DA; 340/347 AD; 340/347 M
[58] Field of Search .... 340/347 M, 347 DA, 347 AD

[56] References Cited

U.S. PATENT DOCUMENTS 3,906,489 9/1975 Schlichte ..................... 340/347 DA

FOREIGN PATENT DOCUMENTS 2423130 11/1975 Fed. Rep. of Germany .
2043946 2/1971 France .

OTHER PUBLICATIONS

Cecil et al., Present and Future Trends in Monolithic A/D and D/A Converter Art, IEEE Computer Society International Conference, Washington, D. C., (Sep. 7-10, 1976), pp. 59-62.

Landee et al., Electronic Designers' Handbook, McGraw-Hill Book Co., Inc., 1957, pp. 23-31.

*Primary Examiner*—T. J. Sloyan
*Attorney, Agent, or Firm*—Hill, Van Santen, Steadman & Simpson

[57] ABSTRACT

Digital signals, in particular PCM signals, each comprising a number of bits, are converted into analog signals with a R-2R chain network which has series resistors each having a resistance value R and shunt resistors having a resistance value 2R, by feeding a constant current into a connection point between the shunt resistor at one end of the network and the adjacent series resistor. The other end is terminated by the resistor which has a value 2R and, in order to convert a digital signal of a number of bits corresponding to the number of shunt resistors, those ends of the shunt resistors which extend away from the series resistors can be connected, in accordance with the bits of the digital signal, either directly to the base of a constant current source or to a summation current line which is virtually maintained at the same potential and which forms an analog signal output, all the resistors of the network being formed by the source-drain paths of MOS transistors which are integrated on a single chip and which are connected individually and in series and are identical to one another.

2 Claims, 1 Drawing Figure

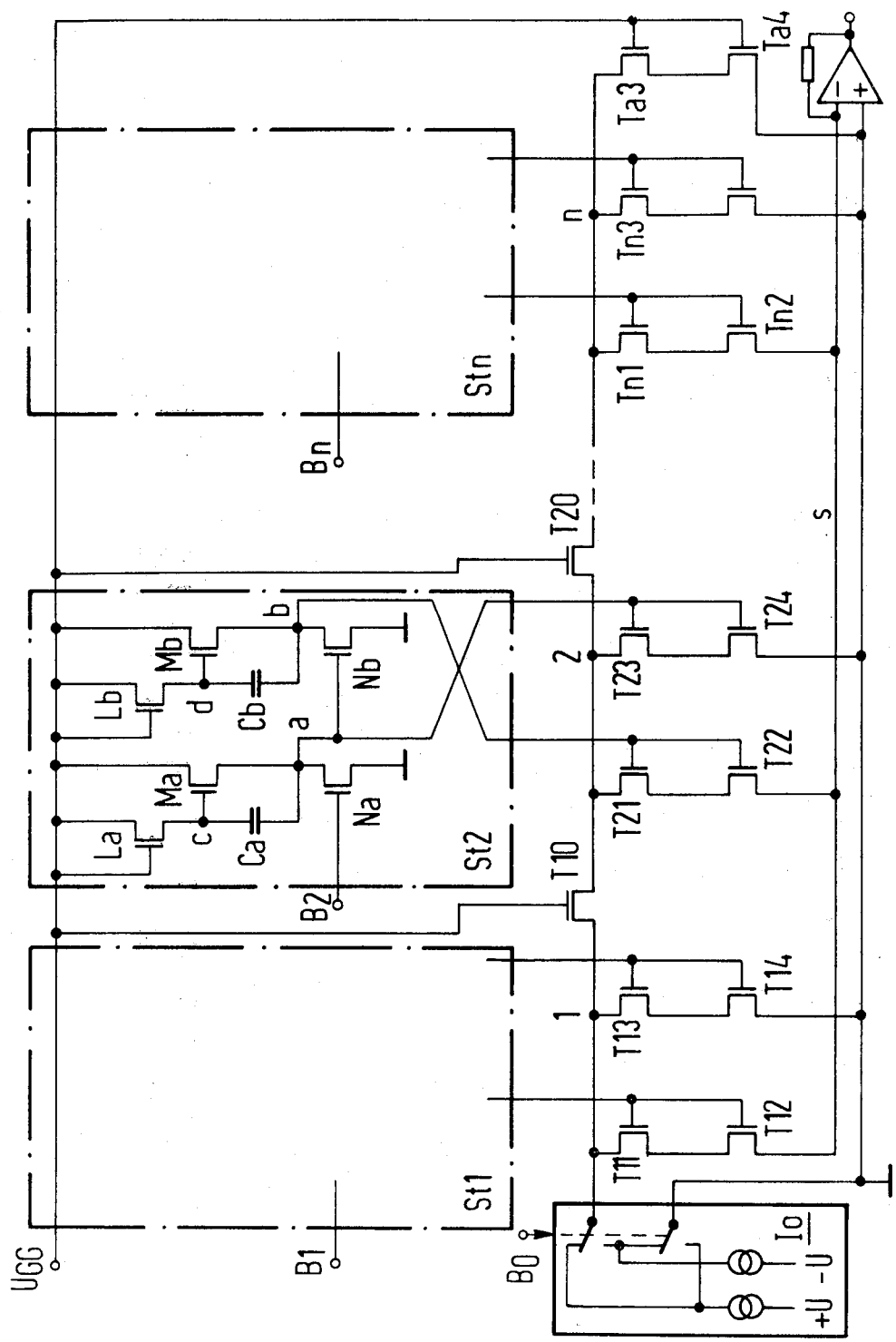

CIRCUIT ARRANGEMENT FOR CONVERTING DIGITAL SIGNALS IN PARTICULAR PCM SIGNALS, INTO CORRESPONDING ANALOG SIGNALS WITH A R-2R CHAIN NETWORK

This is a continuation, of application Ser. No. 054,412, filed July 3, 1979 now abandoned.

BACKGROUND OF THE INVENTION

1. Field of the Invention

The present invention relates to a circuit arrangement for converting digital signals, in particular PCM signals, which in each case comprise a number of bits, into corresponding analog signals, employing a R-2R chain network.

2. Description of the Prior Art

A R-2R chain network of the type mentioned above can be constructed, for example as disclosed in the German allowed published application No. 23 15 986 corresponding to U.S. Pat. No. 3,906,489, such that all of its series resistors and its shunt resistors which are connected to the two ends of the network each have one and the same resistance value R, whereas all the other shunt resistors possess the double resistance value 2R. One end of the R-2R chain network forms the analog signal output. In order to convert digital signals, each comprising $n+m+1$ bits, into analog signals in accordance with a non-linear characteristic curve composed of $2^{m+1}$ linear sections each containing $2^n$ amplitude stages, each connection point of a group of n adjacent connection points of a shunt resistor and at least one series resistor can be selectively supplied with a constant current from one of n constant current sources in accordance with the n lowest bit values of the relevant digital signal, in each case formed by a binary "1". The connection point of the group of n adjacent connection points which extend toward the analog signal output is spaced from the relevant end of the R-2R chain network by a distance corresponding to 1 to $2^{m-1}$ connection points, in accordance with the value of the m bits of the relevant digital signal, in each case formed by a binary "1". The adjacent connection point of a shunt resistor and at least one series resistor, considered in the direction toward the aforementioned end of the R-2R chain network is supplied with a constant current from a separate constant current source in the event that at least one of the m bits of the relevant digital signal is formed by a binary "1".

However, a R-2R chain network of this kind can also be constructed in that (see, for example, Elektronik 21 (1972) 2, 39, 40, FIG. 3; 1978 IEEE International Solid-State Circuits Conference, Digest of Technical Papers, 186, 187, top of FIG. 2), all the series resistors have the resistance value R and all the shunt resistors have the resistance value 2R, wherein one end of the R-2R chain network forms the analog signal output and the other end of the R-2R chain network is terminated by an additional resistor having the resistance value 2R. In order to convert a digital signal, which comprises a number of bits corresponding to the number of shunt resistors, binary voltages corresponding to the bits of the digital signal can be connected to those ends of the shunt resistors which extend away from the series resistors. Here, the R-2R chain network can be constructed in accordance with the German published application No. 24 23 130 corresponding to U.S. Ser. No. 576,991, and French Pat. No. 20 43 946, such that the series resistors which have the resistance value R are formed by the source-drain paths of MOS transistors which are constantly in the conductive state, and the shunt resistors which have the resistance value 2R are formed by the source-drain paths of two MOS transistors or two pairs of MOS transistors of two groups of MOS transistors which are connected to voltage feed sources which are individual to each group and which emit different voltages, which MOS transistors can be alternatively brought into the conduction state from alternatively activated outputs of a control circuit which can be supplied at its input with one bit of the relevant digital signal, in that there control electrodes are operated with the same control potential which is carried by the control electrodes of the MOS transistors which form the series resistors. One of the two MOS transistors (or pairs of MOS transistors) which form the shunt resistors of the R-2R chain network, which are arranged at the end of the chain network facing away from the analog signal output, is connected in parallel with an additional MOS transistor (or pair of MOS transistors) which is constantly in the conductive state.

The accuracy of the digital/analog conversion in a R-2R chain network of this kind is independent not only upon the geometrical tolerances of the MOS transistors, but also to a large extent upon the influence of the particular control electrodes source voltage and control electrode drain voltage upon the resistance of the conductive MOS transistor. As a result the resistance values of the individual MOS transistors deviate relatively considerably in both directions from a theoretically standard resistance value R in dependence upon the bit combination of the particular digital signal, so that the digital/analog conversion can involve an error of up to 20%.

Finally, a R-2R chain network of this kind can be designed in accordance with Electronics 45 (1972) 12, 83, 87, 90, FIG. 5; 1978 IEEE International Solid-State Circuits Conference, Digest of Technical Papers, 186, 187, bottom of (FIG. 2), such that, again, all the series resistors have the resistance value R and all of the shunt resistors have the resistance value 2R, wherein a consant current source is fed in at the point of connection between the shunt resistor connected to one end of the R-2R chain network and the adjacent series resistor, and the other end of the R-2R chain network is terminated by an additional resistor having the resistance value 2R. In order to convert a digital signal which comprises a number of bits corresponding to the number of shunt resistors, those ends of the shunt resistors which extend away from the series resistors can be directly connected, in accordance with the bits of the digital signal, to the base pole of the constant current source or to a sum current line which carries the same potential and which forms the analog signal output.

SUMMARY OF THE INVENTION

The present invention relates to a circuit arrangement for digital/analog conversion employing a R-2R chain network of the above-mentioned type in which the resistors of the R-2R network are formed by MOS transistors. Here, all of the MOS transistors which have the resistance value 2R will be assumed to be formed by a pair of two identical, series-connected MOS transistors having the resistance value R. A R-2R chain network of this kind facilitates precise digital/analog conversion if one has a correspondingly precise resistance value R in all of the MOS transistors so that the accuracy with which the digital/analog conversion takes place is again dependent upon the geometrical tolerances of the MOS transistors and upon the influence of the control electrode source voltages and the control electrode drain voltages upon the resistances of the conductive MOS transistors. In contrast to the above-mentioned arrangements, the object of the present invention is to avoid, at far as possible, impairment of the accuracy of the digital/analog conversion due to the influence of control electrode source voltages and control electrode drain voltages upon the resistances of conductive MOS transistors.

Therefore, the invention relates to a circuit arrangement for converting digital signals, in particular PCM signals, which each comprise a number of bits, into corresponding analog signals, employing a R-2R chain network which consists of series resistors having the resistance value R and shunt resistors having the resistance value 2R, wherein:

(a) into which network a constant current source is fed in at the point of connection between the shunt resistor arranged at one end of the R-2R chain network and the adjacent series resistor;

(b) whose other end is terminated by an additional resistor having the resistance value 2R;

(c) in which, in order to convert a digital signal comprising a number of bits corresponding to the number of shunt resistors, those ends of the shunt resistors which extend away from the series resistors can be connected, in accordance with the bits of the digital signal, either directly to the opposite pole of a constant current source or to a summation current line which is (virtually) maintained at the same potential and which forms the analog signal output;

(d) wherein all of the resistors of the R-2R chain network are formed by the source-drain paths of MOS transistors which are integrated on a chip, are connected individually and in series, and which are identical to one another;

the circuit arrangement being particularly characterized in accordance with the present invention by the combination of the aforementioned features in that (e) the MOS transistors having the source-drain paths of two pairs of series-connected MOS transistors forming the shunt resistors of the R-2R chain network, belong to two groups of pairs of MOS transistors, of which (f) the individual pairs of MOS transistors which belong to one group are each arranged between the relevant connection point of series resistor and shunt resistor of the R-2R chain network and the opposite pole of the constant current source which supplies the constant current with a sign determined the digital signal;

(g) those individual pairs of MOS transistors which belong to the other group are in each case connected between the relevant connection point of a series resistor and a shunt resistor of the R-2R chain network and the summation current line; and wherein (h) the two pairs of MOS transistors can each be alternatively brought into the conduction state by a control circuit which can be supplied at its input with one bit of the relevant digital signal, in that there control electrodes are operated with the same control potential as carried by the control electrodes of the MOS transistors whose source-drain paths from series resistors of the R-2R chain network and which constantly remain in the conductive state.

The invention involves the advantage that, regardless of any residual, different control electrode source voltages and control electrode drain voltages and associated inaccuracy of the resistance values R and 2R, the digital/analog conversion remains virtually unimpaired by these sources of faults and, consequently, the accuracy of the digital/analog conversion is considerably increased.

BRIEF DESCRIPTION OF THE DRAWING

Other objects, features and advantages of the invention, its organization, construction and operation will be best understood from the following detailed description, taken in conjunction with the accompanying drawing, on which there is a single FIGURE which illustrates, in a schematic circuit diagram formed, a circuit arrangement for converting digital signals, in particular PCM signals comprising a number of bits, into corresponding analog signals.

DESCRIPTION OF THE PREFERRED EMBODIMENT

Referring to the drawing, a circuit arrangement for converting digital signals is illustrated, in particular for converting PCM signals which each comprise a number of bits $B_0$, $B_1$, $B_2$ . . . $B_n$ into corresponding analog signals, the fundamental component of which is a R-2R chain network which is constructed with MOS transistors which are identical to one another and which will be assumed to be integrated on a chip.

The R-2R chain network comprises, on the one hand, a plurality of MOS transistors T10, T20, . . . whose source-drain paths form the series resistors of the R-2R chain network and which will be assumed to be formed by n channel MOS transistors of the enhancement type. These MOS transistors are connected by their control electrodes to a control voltage $U_{GG}$ of, for example, +12 V by which they are constantly maintained in the conductive state.

On the other hand, the R-2R chain network comprises a plurality of MOS transistors T11–T12, T13–T14, . . . Tn1–Tn2, Tn3–Tn4, whose source-drain paths, in each case connected in series in pairs, form the shunt resistors of the R-2R chain network, and which will likewise be assumed to be formed by n channel MOS transistors of the enhancement type. The pairs of MOS transistors T11–Tn4 form pairs of transistors T11–T12, T13–T14 . . . Tn1–Tn2, Tn3–Tn4, each connected to an individual control circuit Stl . . . Stn, of pairs of MOS transistors which belong to two groups T11–T12, T21–T22, . . . Tn1–Tn2; T13–T14, T23–T24 . . . Tn3–Tn4 of pairs of MOS transistors.

Here, a pair of MOS transistors, such as for example the pair T23–T24, which belong to one group T13–T14, . . . Tn3–Tn4 of pairs of MOS transistors is connected between the relevent connection point (2) of a series resistor and a shunt resistor of the R-2R chain network and the opposite pole, here ground, of a constant current source Io which feeds in a constant current of, for example, 200 μA, having a sign determined by the sign bit $B_0$ of the particular digital signal which is to be converted, at the connection point 1 of the shunt resistor arranged at one end of the R-2R chain network and the adjacent series resistor. A constant current source of this kind which serves to produce bipolar constant currents can fundamentally be designed in a well known manner (for example as disclosed in Elektronik 21 (1972) 5, 165, 167, FIG. 12) for which reason it will not be discussed further here. At the end facing away from the constant current source Io, the R-2R chain network is terminated by a pair of series-connected MOS transistors Ta3–Ta4 which form a 2R resistor and whose control electrodes are constantly connected to the aforementioned control voltage $U_{GG}$ so that the pair of MOS transistors Ta3–Ta4 is constantly in the conductive state. The pairs of MOS transistors, such as for example the pair T21–T22, which belong to the other group T11–T12, Tn1–Tn2 of pairs of MOS transistors are each arranged between the relevant connection point, for example the connection point 2, of a series resistor and a shunt resistor of the R-2R chain network and its analog signal output is formed by a sum current line s. In the circuit arrangement illustrated on the drawing, the sum current line s is connected to an inverting input ($-$) of an operational amplifier which is connected as an inverting amplifier and whose non-inverting input ($+$) is connected to the base of the constant current source Io, namely to ground, and consequently the sum current line s is constantly maintained at the same potential (virtual ground) as the base of the constant current source Io.

As illustrated on the drawing, in respect to the control circuit St2, the control circuits Stl, . . . Stn of the individual pairs T11–T12, T13–T14, . . . ; Tn1–Tn2, Tn3–Tn4 of pairs of MOS transistors T11–T12, . . . Tn3–Tn4 can each possess two chain-connected inverters which consist of MOS transistors Na, Nb. These MOS transistors Na, Nb are each connected by their one main electrode to the base of the constant current source (ground), whereas the other main electrode is, in each case, connected by way of a bootstrap circuit Ca, La, Ma and Cb, Lb, Mb, likewise constructed with MOS transistors Ma, La and Mb, Lb to a line which carries the aforementioned control voltage $U_{GG}$ of, for example, $+12V$. Here again, all of the MOS transistors of the control circuits St will be assumed to be formed by n channel MOS transistors of the enhancement type.

The control electrode of the MOS transistor Na which forms the one inverter is supplied with the bit $B_2$ which is taken, due to its position within the digital signal, to be converted, in that when a "1" bit is supplied a potential of, e.g. $+10$ V and when a "0" is supplied with a potential of, for example, 0 V is connected to the control electrode of the MOS transistor Na. In the former case, i.e. when a "1" bit is supplied, the MOS transistor Na is rendered conductive and a potential of approximately 0 V occurs across the circuit point a. At the same time, the MOS transistor Na is conductive and initially the MOS transistor La is conductive until a potential of approximately $+10$ V occurs across the circuit point c. Simultaneously, the MOS transistor Nb is blocked and a potential of $+12$ V occurs across the circuit point b and a potential of approximately $+20$ V occurs at the circuit point d. Therefore, the control circuit St2 causes the MOS transistors T21–T22 of the R-2R chain network, which are connected by their control electrodes to the circuit point b, to be brought into the conductive state, whereas the MOS transistors T23–T24 which are connected by their control electrodes to the circuit point a are blocked.

In the second situation, i.e. when a "0" bit is supplied, the MOS transistor Na is brought into the blocked state and at the circuit point c the potential shifts to approximately $+20$ V, whereas the potential of $+12$ V occurs across the circuit point a, and at the same time the MOS transistor Nb is brought into the conductive state and a potential of approximately 0 V occurs at the circuit point b and a potential of approximately $+10$ V occurs at the circuit point d. Then, the control circuit St2 brings the pair of MOS transistors T23–T24 into the conductive state, whereas the pair of MOS transistors T21–T22 is brought into the blocked state.

Although not illustrated in detail on the drawing, the other control circuits St1, . . . Stn can also be designed in a similar manner and thus can also control the pairs of MOS transistors of the R-2R chain network to which they are connected in a similar manner.

When the control circuits St are designed as illustrated on the drawing with two chain-connected MOS transistor inverters which are each connected to a bootstrap circuit, the function of the bootstrap circuits is to connect the full control voltage $U_{GG}$ to the control electrodes of the pair of MOS transistors of the R-2R chain network which is to be brought into the conductive state. Instead, and in contrast to the conditions illustrated on the drawing, the control circuits St could also be designed such that the MOS transistors which form the inverters are each connected to the line carrying the control voltage $U_{GG}$ via a n channel MOS transistor of the depletion type, employed as a load resistor. Control circuits of this type are basically known from the German published application No. 24 23 130, which corresponds to U.S. Ser. No. 576,991, and are therefore well known in the art and will not be discussed in detail herein. Furthermore, the control circuits can also consist of bistable trigger circuits provided with corresponding load elements so that again the full control voltage $U_{GG}$ is connected to the control electrodes of the relevant pair of MOS transistors of the R-2R chain network. Again, because the circuits are well known in the art, the same will not be discussed in detail herein.

The control circuits St1, . . . Stn which can be supplied at their inputs with the individual bits $B_1$. . . $B_n$ of the digital signal which is to be converted, thus feed the control electrodes of the MOS transistors Ti1–Ti2 and Ti3–Ti4 of the relevant one of the two pairs of MOS transistors Ti1–Ti2, Ti3–Ti4 driven by the relevant control circuit Sti (i=1 . . . n) with the same control voltage $U_{GG}$ which is connected to the control electrodes of the permanently-connected MOS transistors T10, T20 . . . and Ta3–Ta4; the MOS transistors Ti3–Ti4 and Ti1–Ti2 of the particular other pair of MOS transistors operated by the relevant control circuit Sti are fed, at their control electrodes, with a control voltage which lies below the threshold voltage of the MOS transistors. Therefore, in accordance with the bit $B_i$ of the digital signal which is to be converted and which is supplied to the relevant control circuit Sti, one of the two pairs of MOS transistors is conductive, namely on the occurrence of a bit "0" it is the pair of MOS transistors Ti3--Ti4 which leads to the opposite pole of the constant current source Io, which is conductive, whereas at the occurrence of a "1" bit it is the pair of MOS transistors Ti1–Ti2 which leads to the sum current line s which is (virtually) maintained at the same potential and which forms the analog signal output, which is conductive.

Under the influence of different control electrode source voltages and control electrode drain voltages, the resistance values of the individual MOS transistors deviate to a greater or lesser extent from a resistance value R which is standard for all the MOS transistors, in that under the given condition, when the constant current fed into the R-2R chain network from the constant current source Io has a positive (negative) sign, the resistance of the MOS transistor Ti1, Ti3 connected to the series arm of the R-2R chain network of a pair of MOS transistors arranged in a shunt arm of the R-2R chain network is greater (smaller) than the resistance value of the MOS transistor Ti2, Ti4 which extends away from the series arm of the R-2R chain network, of the relevant pair of MOS transistors. However, the fact that the control electrodes of the particular conductive MOS transistors which form shunt resistors, and the control electrodes of the constantly-conductive MOS transistors which form the series resistors and the terminal resistor of the R-2R chain network are supplied with one and the same control voltage $U_{GG}$ in association with the (virtual) equality of potential carried by the sum current line s which forms the analog signal output and carried by the base of the constant current source Io, ensures that the resistance value of each MOS transistor Ti0 which forms a series resistor is precisely equal to the resistance value of the MOS transistor Ti1 and Ti3 to which it is directly connected on the side of the constant current source and which belongs to the currently-conductive pair of MOS transistors Ti1–Ti2 and Ti3–Ti4 which forms the shunt resistor, whereas the resistance value of the particular other MOS transistor of this pair of MOS transistors is, apart from negligible deviations, equal to the resistance value of the remaining part of the R-2R chain network which extends away from the current source. Consequently, in response to a digital signal $B_0B_1B_2 \ldots B_n$ which is to be converted, a sum current which represents an analog signal corresponding exactly to the digital signal occurs on the sum current line s in accordance with the relationship $$I = \sum_{i=1}^{n} B_i \cdot I_o/2^i.$$

Finally, it should be pointed out that the abovedescribed examplary embodiment is based on the use of n channel MOS transistors; however, it is also possible to use p channel MOS transistors of the enhancement type in which case it would be necessary to provide a control voltage $U_{GG}$ which is equal to $-12$ V.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a circuit arrangement for converting multibit digital signals intoo analog signals, of the type in which an R-2R ladder network includes series resistors each having a resistance value R and shunt resistors each having a resistance value 2R, the improvement therein comprising:

a constant current feed connected to one end of said ladder including a first pole connected to a junction point of a shunt resistor and the adjacent series resistor at the end of the ladder and a second pole connected to a reference terminal;

an additional 2R resistor terminating the opposite end of the ladder network;

the shunt resistors divided into first and second pairs on each side of a series resistor; a sum line connected to a first shunt resistor of each pair at the ends opposite to those ends connected to a series resistor and said reference terminal connected to the second shunt resistor of each pair at the end which is not connected to a series resistor, said sum line and said reference terminal providing an analog signal output;

each of the resistors of the R-2R ladder network comprising identical metal-oxide-semiconductor transistors with each series resistor formed of a single transistor with its source and drain constituting the terminals of the resistor, and each shunt resistor comprising two of the transistors connected in series so that the source of one and the drain of the other constitute terminals of the respective 2R resistor, said metal-oxide-semiconductor transistors all integrated on a chip;

the transistors forming the shunt resistors being divided into two groups in which the one group is constituted by the first resistors and the second group is constituted by the second resistors;

said transistors of said series resistors including gates connected to an operating voltage for providing constant conduction and the transistors of said shunt resistors connected to receive control signals representing the digital signals to be converted; and a plurality of control circuits each connected to the operating voltage and each including an input for receiving a bit of the multi-bit digital signals and outputs for providing said control signals at substantially the same voltage as said operating voltage, said transistors of said shunt resistors including gates connected to said outputs so that said transistors are driven with substantially the same potential as the operating voltage driving said transistors of said series resistors.

2. The improved circuit arrangement of claim 1, and further comprising:

a differential operational amplifier including an inverting input connected to the sum line, a non-inverting input connected to the reference terminal, an output, and a feedback circuit connected between said output and said inverting input.

* * * * *